United States Patent [19]

Faust et al.

[11] 4,232,235
[45] Nov. 4, 1980

[54] COMBINING THYRISTOR CIRCUITS OF VARIOUS CIRCUIT CONFIGURATIONS

[75] Inventors: Werner Faust, Wettingen; Peter Etter, Oberehrendingen, both of Switzerland

[73] Assignee: BBC Brown, Boveri & Company, Limited, Baden, Switzerland

[21] Appl. No.: 867,945

[22] Filed: Jan. 9, 1978

Related U.S. Application Data

[63] Continuation of Ser. No. 700,560, Jun. 28, 1976, abandoned.

[30] Foreign Application Priority Data

Jul. 2, 1975 [CH] Switzerland ........................ 8575/75

[51] Int. Cl.² ........................................... H03K 17/72
[52] U.S. Cl. .................................. 307/252 R; 307/318; 323/22 Z; 361/56; 361/91
[58] Field of Search ............ 307/252 J, 252 L, 252 R, 307/252 M, 252 N, 318; 361/56, 91, 111; 323/22 Z; 363/68

[56] References Cited

U.S. PATENT DOCUMENTS

| | | | |
|---|---|---|---|
| 3,444,398 | 5/1969 | Brockway | 307/252 J |
| 3,553,725 | 1/1971 | Miki | 307/252 J |
| 3,599,075 | 8/1971 | Etter et al. | 363/68 X |
| 3,947,726 | 3/1976 | DeCecco et al. | 361/56 |

*Primary Examiner*—John Zazworsky
*Attorney, Agent, or Firm*—Frank L. Durr; Orville N. Greene

[57] ABSTRACT

Thyristors included in circuit configurations are, in turn, connected in series circuit fashion such that n circuit configurations are so interconnected, where n is a real integer equal to or greater than 2. The circuit configurations provide a combination of functions such as current limiting, voltage distribution, assumption of storage load, limitation of commutation voltage and limitation of search voltage. The combined circuit configurations provide the most practical arrangement of desired characteristics to meet the requirements for specific applications.

12 Claims, 25 Drawing Figures

COMBINING THYRISTOR CIRCUITS OF VARIOUS CIRCUIT CONFIGURATIONS

RELATED CASES

The present application is a continuation of U.S. patent application Ser. No. 700,560, filed June 28, 1976, now abandoned.

BACKGROUND OF THE INVENTION

The present invention relates to thyristors and more particularly to circuit configurations each including at least one thyristor, which circuit configurations are connectible in series in order to obtain a resultant series circuit in which the desired characteristics are optimized.

Normally the following points are of primary consideration when considering the use in connection of thyristors.

I. Equalization of the various thyristor properties which result from the voltage distribution.

II. The most practical distribution of total voltage on the individual thyristors in accordance with external voltage stress, as well as voltage limitation of the individual thyristors, particularly with respect to maintaining surge voltage in the most practical range of the surge front with minimum loss.

In more specific terms, circuit arrangements employing thyristors should ideally meet the following criteria:

1. Voltage distribution in accordance with operating frequency.
2. Take-up of the storage load.
3. Limitation of the commutation voltage.
4. Voltage limitation at the thyristor.
5. dv/dt-limitation by surge voltage load.

A great number of various circuit arrangements for thyristor circuits have been proposed. Typical of these are the following three circuits (shown in FIGS. 1-3 herein).

Figure 1:
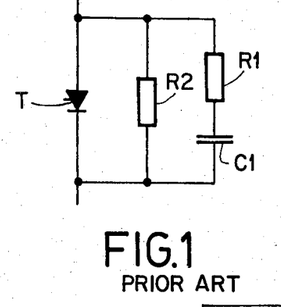
FIGS. 1-3 show schematic diagrams of three different embodiments of circuit configurations employing thyristors.

FIG. 1 shows a circuit configuration in which R1-C1 and R2 branches are connected in parallel with one another and with a thyristor T. Note, for example, the ASEA Publication 16 (1971) Vol. 2, page 39 entitled "Thyristor Valves For The Expanded HGÜ-Gotland Arrangement". The circuit configuration of FIG. 1 fulfills to a limited extent the above requirements 1 and 2, but for a number of reasons is not voltage limiting.

Figure 2:
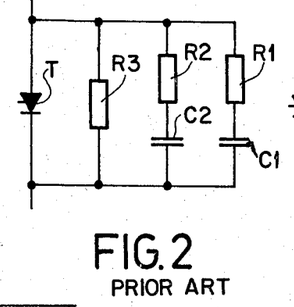

The arrangement of FIG. 2 includes three parallel paths consisting of the elements R1-C1, R2-C2 and R3, respectively, which are connected in parallel with one another and with thyristor T. The resulting configuration is useful in a larger frequency range than the circuit of FIG. 1. However, the circuit of FIG. 2 is not voltage limiting (see CIGRE International Conference on Large High-Tension Electric Systems—1972 Session August 28—September 6, pages 14 and 61).

Figure 3:
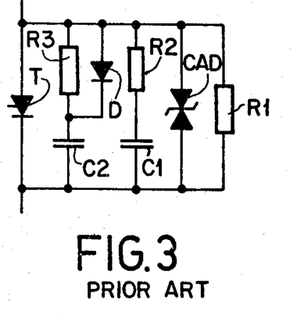

Finally, FIG. 3 shows the circuit configuration of the HGÜ-valve for the Power Plant "Cabora Bassa" in Mozambique, which is a cooperative development of the HGÜworking agreement of AEG, BBC and Siemans. The circuit of FIG. 3 fulfills requirements 1-3 above. The voltage limitation of thyristor T (requirement 4) comes about through the use of a CAD element condition ("Controlled Avalanche Diode" ≡ Diode with Homogeneous Avalanche Breakdown), while requirement 5, the dv/dt limitation by surge voltage load is obtained through the diode D and the R3-C2 circuit branch.

BRIEF DESCRIPTION OF THE INVENTION

The invention is based upon the need for appreciably increasing the voltage exploitation of thyristors, while at the same time providing a cost reducing design. This is achieved by the employment of a scheme in which the final circuit configuration comprises a series connection of n circuits, at least two of which have different impedances or different V-I (voltage-current) characteristic curves and wherein at least one of the circuit configurations is equipped with a voltage limiting element.

The above arrangement permits a greater adaptability of the resultant circuit to take advantage of the special properties of the thyristors as well as taking fully into account all of the possible requirements imposed upon the final circuit design. The resultant series circuit can, for example, provide a differing characteristic for each voltage direction and solve different problems such as, for example, a sharp limitation of the commutation overshoot and sharp limitation of the voltage stress imposed upon the thyristors. This is particularly advantageous when dealing with series connected thyristors, in that the limited prohibiting stress is in the negative direction (breakthrough voltage) and the sweep voltage (blocking voltage) is widely spread, especially if the thyristors in the prohibited direction show no "controlled avalanche" behavoir (homogeneous avalanche breakthrough).

BRIEF DESCRIPTION OF THE FIGURES

FIGS. 5-25 show schematic diagrams of individual circuit configurations which may be selectively employed in various combinations in a series connected circuit of the type shown in FIG. 4.

FIGS. 5a-25a show the voltage-current characteristic curves for the circuits 5-25, respectively.

FIGS. 7b-13b show the voltage-time characteristic curves for the circuits of 7-13, respectively.

FIGS. 16b-22b show the negative polarity voltage-time characteristic curves for the circuits of FIGS. 16-22, respectively; and FIGS. 16c-22c show the positive polarity voltage-time characteristic curves for the circuits of FIGS. 16-22, respectively.

DETAILED DESCRIPTION OF THE INVENTION AND THE PREFERRED EMBODIMENTS THEREOF

Figure 4:
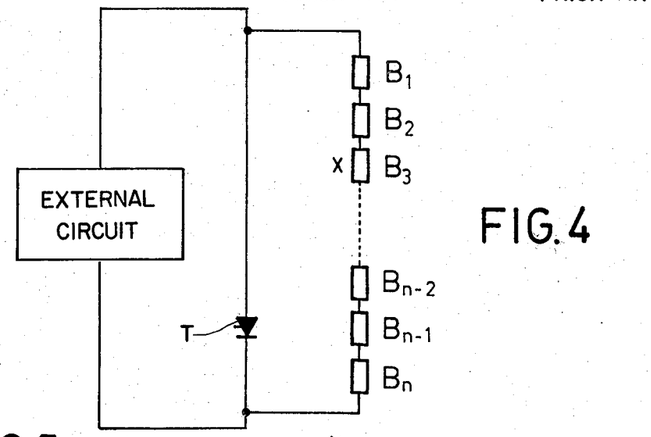
FIG. 4 shows a simplified block diagram of n series connected groups and embodying the principles of the present invention.

Referring now to the drawings, wherein like identifying characters indicate like elements, there is shown in FIG. 4 a thyristor T with anode and cathode and a plurality of series connected sub-circuits B1-Bn connected in parallel with thyristor T. The opposite terminals of thyristor T are also connected to opposite terminals of an external circuit. According to the invention, the series connected sub-circuits comprise a plurality of series connected circuit configurations B1, B2, ..., Bn of different impedances. At least one of the sub-circuit configurations (for example, note the circuit configuration B3 denoted with an "X") is provided with a voltage limiting element. Those sub-circuit configurations in the Figures to be described hereinbelow represent the circuit configurations which may be combined to provide a resultant series circuit which meet the desired objectives. Other additional conventional circuit configurations such as, for example, a dv/dt limitation circuit arrangement may also be utilized (for example, note the parallel branch of FIG. 3, including the elements R3-C2).

Figure 5:
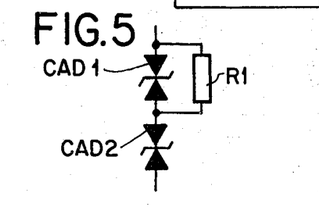
Figure 5A:
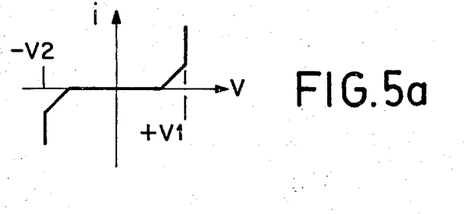
Figure 6:
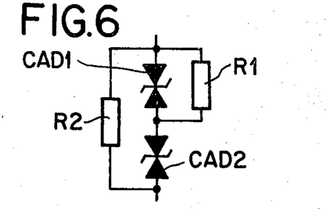

FIGS. 5 and 6 show two series connected elements CAD1 and CAD2, each of which represent series opposed diodes with controlled avalanche behavoir or, in other words, homogeneous avalanche breakthrough. In FIG. 5, CAD1 has a resistor R1 connected in parallel therewith. The current-voltage characteristic curve for the circuit of FIG. 5 is shown in FIG. 5a. Both of the CAD elements limit the total voltage across the thyristor (T in FIG. 4). The resistance causes a current flow (i) through the circuit if the total breakdown voltage of CAD2 is exceeded. In this way, by reducing (for example, by halving) the thyristor limiting voltage, a known limitation of the thyristor voltage to a desired current example, a few amperes) will be obtained. These currents can, for example, occur at the end of the current flow time following the carrier storage effect. In this way, the commutating overshoot can be limited and can be lowered.

Figure 6A:
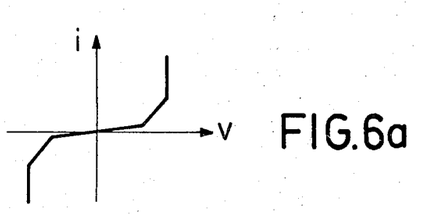

The characteristic voltage-current curves of FIGS. 5 and 6 are shown respectively in FIGS. 5a and 6a. Due to the bidirectional nature of the CAD elements, the voltage limiting characteristics are obtained as shown at +v1 and −v2 of FIG. 5a, for example.

In the following examples it will be assumed that at least two sub-circuit configurations are connected although certainly more than two may be employed, if desired.

Figure 7:
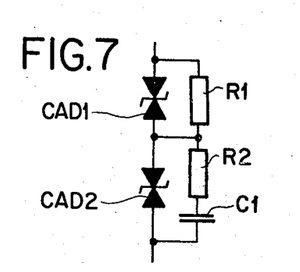
Figure 7A:
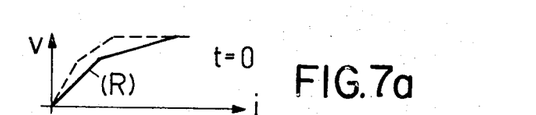
Figure 7B:
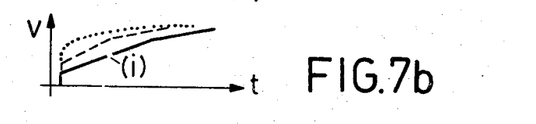

In the circuit in accordance with FIG. 7, CAD1 and R1 are connected in parallel while CAD2 is connected in parallel with the series branch circuit comprised of R2 and C1. The voltage limitation and the piecewise static voltage-current characteristic curves are obtained through the circuit of FIG. 7 (as shown by FIGS. 7a and 7b). The branch path comprised of R2-C1 additionally cooperate to provide a known time relation, as the loading of the capacitor requires a certain time interval, for example, before being charged up to the storage load of the thyristors. At time t=O, only the resistances draw current. The breakthrough voltage of CAD2 will eventually be achieved first within a fixed predetermined time delay which is dependent upon the values of C1 and R2, as well as the magnitude of the current i. Again, here exists a certain, although not strongly expressed limitation, of the commutating overshot if the back current is small.

Figure 8:
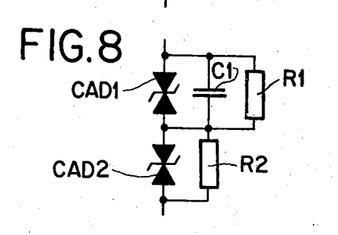

In the circuit according to FIG. 8, R1 and C1 are connected in parallel with one another and are further connected in parallel with CAD1. R2 is connected in parallel with CAD2. At time t=O, C1 is assumed to have no voltage across its plates and can discharge again over the parallel connected resistor R1. As a result, the voltage on the circuit will be much stronger than the circuits previously described, and approached through the breakthrough voltage, and will be limited only by CAD2 having R2 connected in parallel therewith. With this circuit configuration, the commutating overvoltage can be effectively fully limited. Thus, the established full voltage through elements CAD1 and CAD2 can be achieved only by long high overvoltage across the circuited thyristor.

Figure 8A:
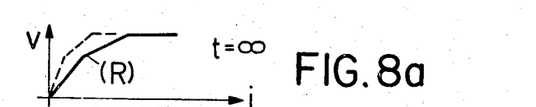
Figure 8B:
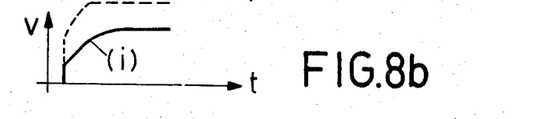

Again, FIGS. 8a and 8b show the voltage-current and the voltage-time characteristic curves wherein R (resistance) serves as the parameter for FIG. 8a while i (current) serves as the parameter for FIG. 8b (as well as subsequent Figures).

Figure 9:
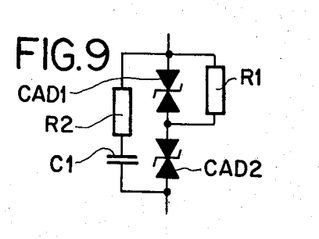
Figure 9A:
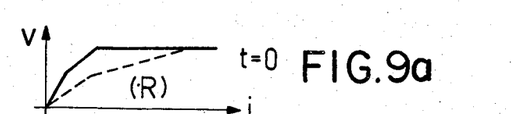
Figure 9B:
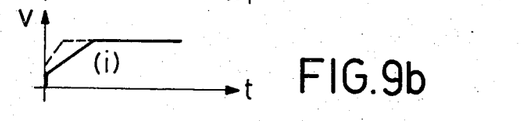

The circuit of FIG. 9 is comprised of a combination of the circuit of FIG. 5, together with the series branch comprised of R2-C1 connected in parallel across the series connected elements CAD1 and CAD2. The values of C1 and R2 are appropriately chosen for the particular storage load. Upon the occurrence of higher thyristor voltage, the piecewise voltage-current characteristic curve of FIG. 9a will be operative. With this arrangement, the special voltage limitation results again for the commutating oscillations as long as the magnitude of the current i into the circuit of FIG. 9 is not too large.

Figure 10:
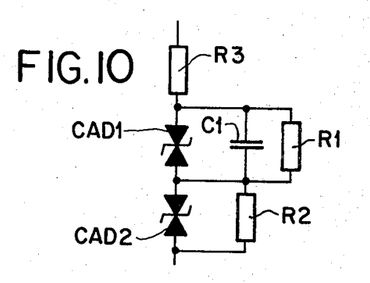
Figure 10A:
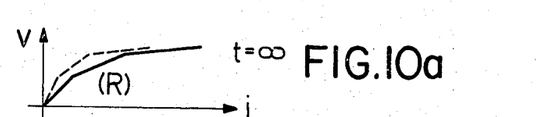
Figure 10B:
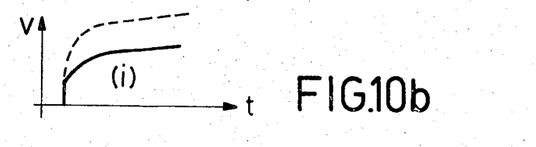
Figures 11, 11A, 11B:
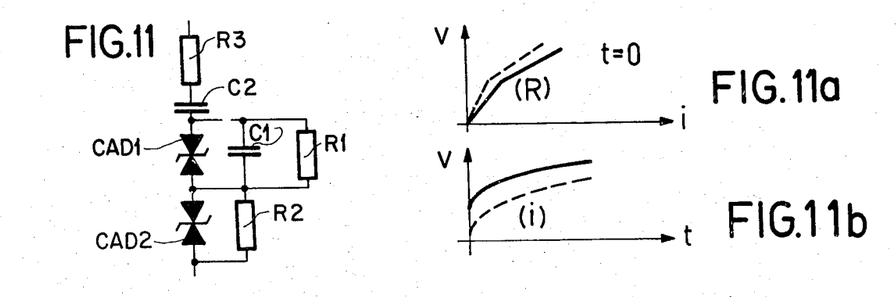

With regard to the circuits shown in FIGS. 10 and 11, respectively, a resistor R3 is connected in series with the series connected elements CAD1 and CAD2, and a resistor R3 and a capacitor C2 are series connected with the elements CAD1 and CAD2. The voltage limitation effect is, as a result, only weakly expressed and otherwise, the circuit construction is substantially similar to that shown in FIG. 8.

Figures 12, 12A, 12B:
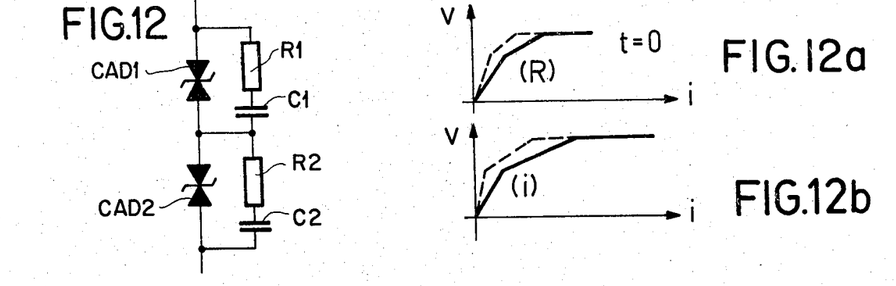

In FIG. 12, the elements CAD1 and CAD2 each have connected thereacross a series circuit branch comprised of R1-C1 and R2-C2 respectively, which serve as differential time constants. The values for the elements in one of the two series circuit branches is chosen for the particular storage loads. The values of the elements in the second series circuit branch are chosen to provide a larger time constant and will only be loaded by overvoltages of a longerr time interval. In this way, a certain limitation of the commutation overvoltage can be achieved. Furthermore, the thyristor voltage T (FIG. 4) will be limited by the CAD elements as is the case with the circuits of FIGS. 5–9.

Figure 13:
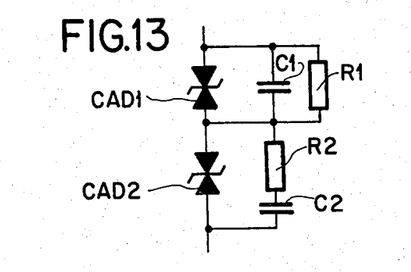
Figure 13A:
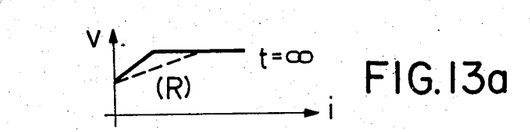
Figure 13B:
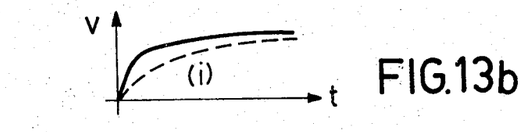

In the circuit of FIG. 13, there is provided a parallel RC circuit (R1-C1) and a series RC circuit (R2-C2), each of these branch circuits being respectively connected across CAD1 and CAD2. The voltage limitation effect for commutation overshoot is similar to that obtained in the circuit of FIG. 8, but essentially more strongly expressed than the other wiring circuit configurations, wherein "wiring" when used in connection with a thyristor means the connection of a wiring circuit directly in parallel with the thyristor and with no other element. Again, the limitation of the total thyristor voltage is obtained through the employment of the two series connected CAD circuit elements (CAD1 and CAD2).

Figure 14:
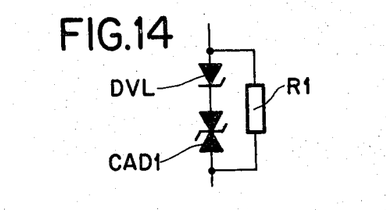
Figure 14A:
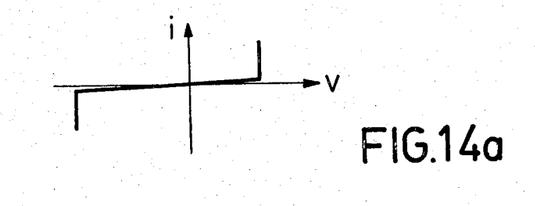
Figure 15:
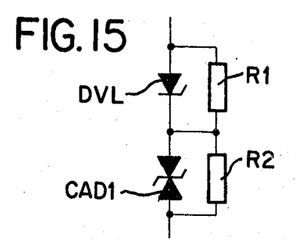
Figure 15A:
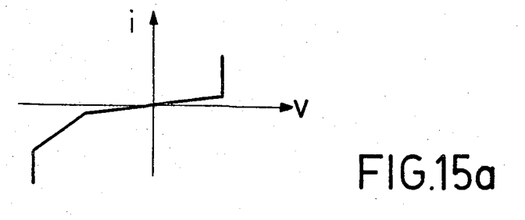

FIG. 14 provides an asymmetrical voltage-current characteristic curve as shown in FIG. 14a. The breakthrough voltages differ for the respective positive and negative voltage directions. With this object in mind, a voltage limiting diode, i.e., a diode DVL with a controlled avalanche behavoir, is further connected in series with CAD1. A circuit of this type is advantageous for use with thyristors employed in non-symmetrical voltage applications, for example, in cases where the sweep voltage may be lower than the breakthrough voltage of the inverse direction (i.e. the high resistance or backward direction). In FIG. 15 there is shown a resistance R1 connected in parallel with avalanche diode DVL and a resistance element R2 connected in parallel with CAD1. This circuitry provides an asymmetric voltage-current characteristic curve as shown in FIG. 15a, which curve is similar to that obtained through the circuit configuration of FIG. 5. In FIG. 5, however, a symmetrical voltage-current characteristic curve is obtained. The voltage asymmetry of the circuit is obtained, while the limitation of the commutating overshoot is necessary only in the inverse direction.

In the backward direction of the thyristors, a limitation of the thyristor voltage can be achieved by somewhat of a half-thyristor voltage, if the current is not too high. Furthermore, we have obtained herein the voltage limitation by full thyristor voltage.

Figure 16:
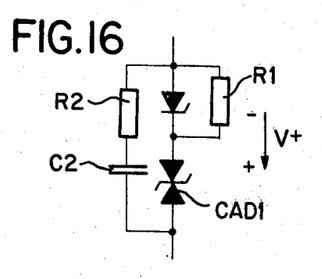
Figure 16A:
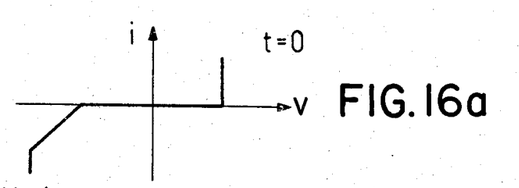
Figure 16B:
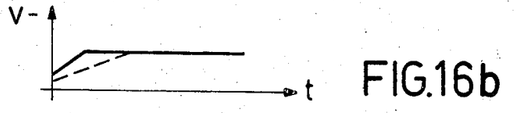
Figure 16C:
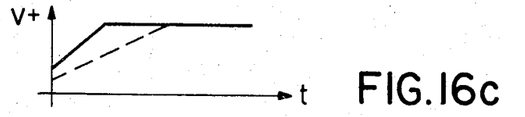

In the arrangement of FIG. 16, the series connected branch circuit of R2-C2 is connected in parallel across diode element T2 and element CAD1 in order to take up the storage load and to limit the commutating overshoot. The voltage limiting operation of the commutating overshoot becomes still higher. The operation of the circuit in the backward or reverse direction is similar to that of the circuit shown in FIG. 9. The voltage-current characteristic curve is shown in FIG. 16a as being asymmetrical in nature while FIGS. 16b and 16c show the voltage-time characteristic curve for forward and reverse voltage operation.

Figure 17:
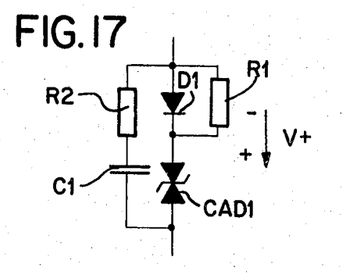
Figures 17A, 17B:
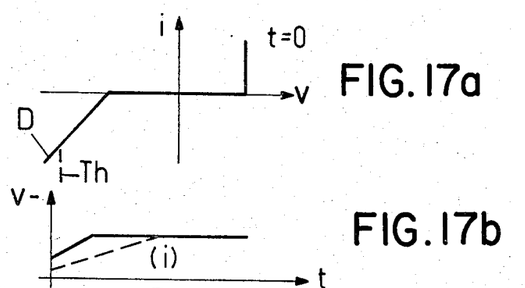
Figure 17C:
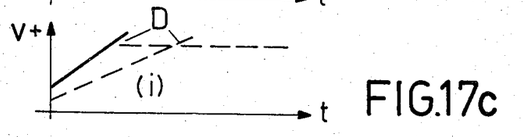

The circuit configuration of FIG. 17 differs from that of FIG. 16 in that a conventional diode D1 (replacing a voltage limiting diode) is connected in series with element CAD1 thereby eliminating the voltage limitation characteristic. This configuration is adequate, for example, if the thyristor is provided with a controlled avalanche behavior in the inverse direction.

Figure 18:
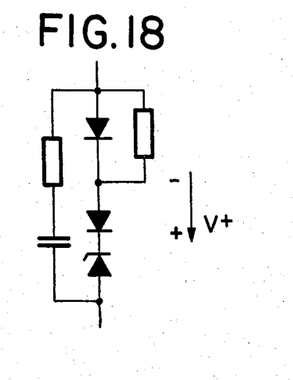
Figure 18A:
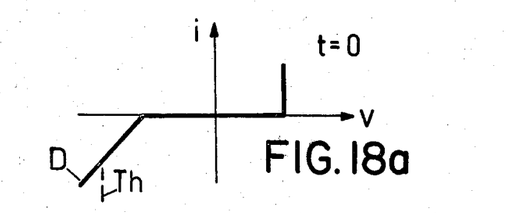
Figure 18B:
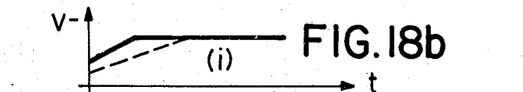
Figure 18C:
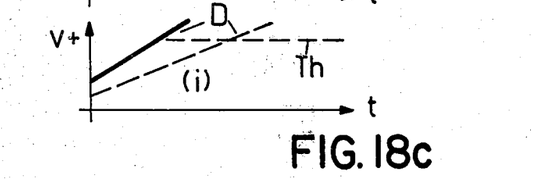

The circuit configuration in accordance with FIG. 18 is used for those applications in which the voltage direction, for example, the inverse direction, employs conventional diodes and for the blocking direction employs voltage limiting diodes.

Figure 19:
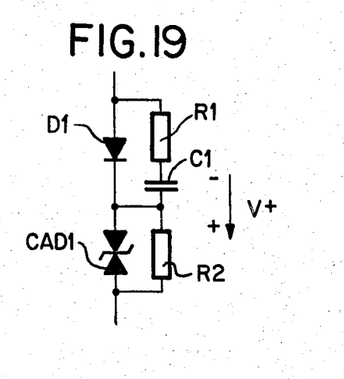
Figures 19A, 19C:
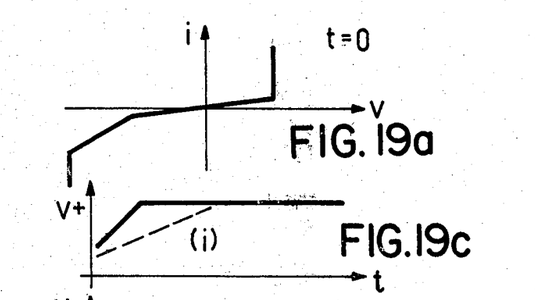
Figure 19B:
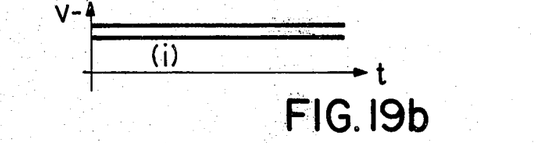

The circuit configuration of FIG. 19 employs for the inverse direction of the thyristors an arrangement similar to that of the circuit shown in FIG. 7 in which limitation of the thyristor total voltage in the inverse direction and limitation of the commutation overshoot is provided. In place of a series circuit branch of R1-C1 placed in parallel with the diodes, separate parallel connected R and C circuit branches may also be utilized. There is a better accommodation of the commutation overshoot in that no voltage loss needs to be considered at a resistance. The voltage limitation is merely foreseen for the blocking direction.

Figure 20:
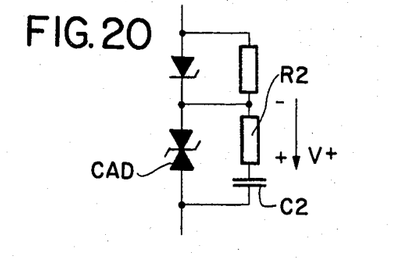
Figures 20A, 20B:
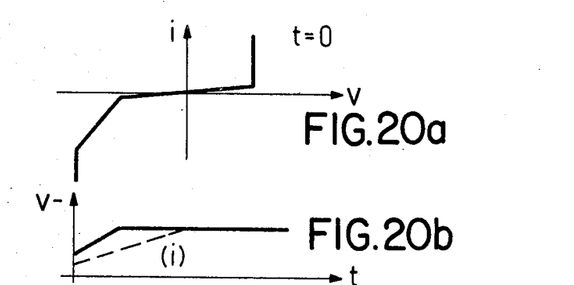
Figure 20C:
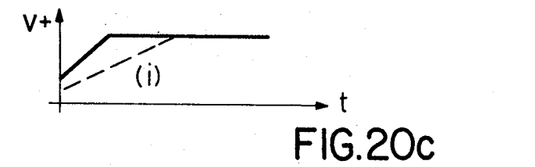

The circuit of FIG. 20 differs from that shown in FIG. 19 in that the series R-C branch (R2-C2) is connected in parallel with the CAD element and further because the circuit is operational for both voltage directions. This can be advantageous for a dv/dt limitation of the thyristor voltage. Otherwise, the retention is similar in both the circuits shown in FIGS. 19 and 20.

In the characteristic curves 21a–21c, the letter D means diode and Th means thyristor (as is the case with the subsequent waveform diagrams).

Figure 21:
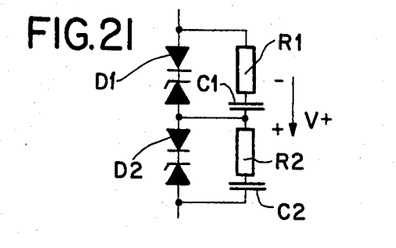
Figure 21A:
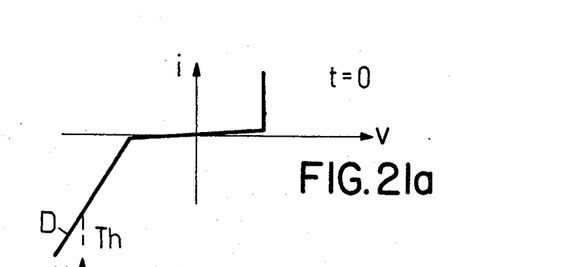
Figure 21B:
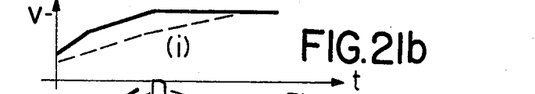
Figure 21C:
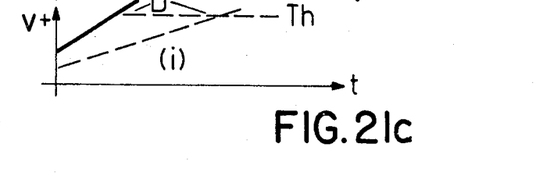

In the circuit of FIG. 21 a pair of series connected R-C differentiating time constant circuit branches are employed as shown at R1-C1 and R2-C2. The diodes D1 and D2 exhibit voltage limiting retention for the blocking direction of the thyristors which is not the case for the inverse direction. The latter is, for example, not necessary if the thyristor exhibits self-controlled avalanche behavior. Operationally, the circuit of FIG. 21 behaves similar to that shown in FIG. 12.

Figure 22:
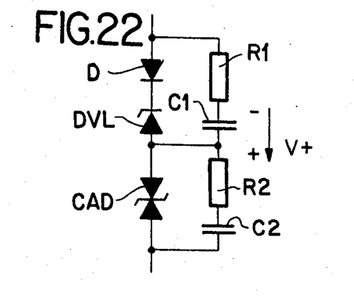
Figure 22A:
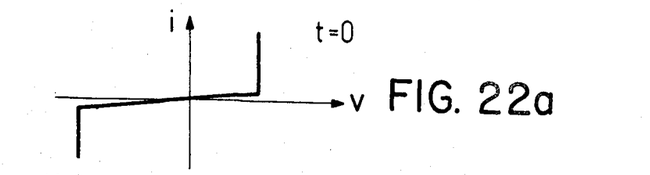
Figure 22B:
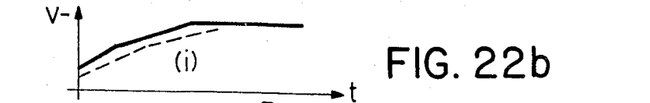
Figure 22C:
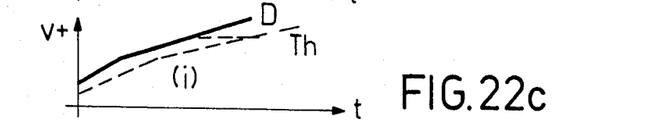

The circuit configuration of FIG. 22 also employs first and second R-C series connected branches (R1-C1 and R2-C2) and is operationally similar to FIG. 12 for the inverse direction of the thyristors, since the diode D1 is not a voltage limiting diode.

Figures 23, 23A:
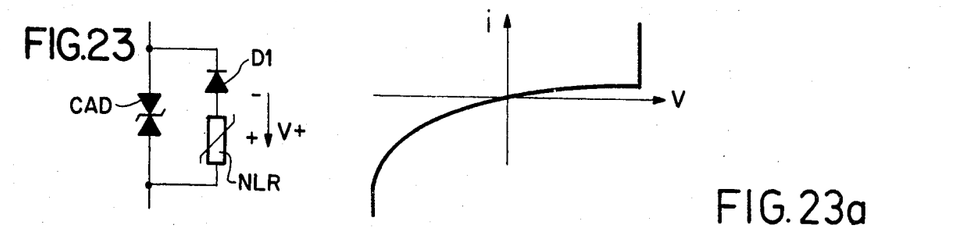
Figures 24, 24A:
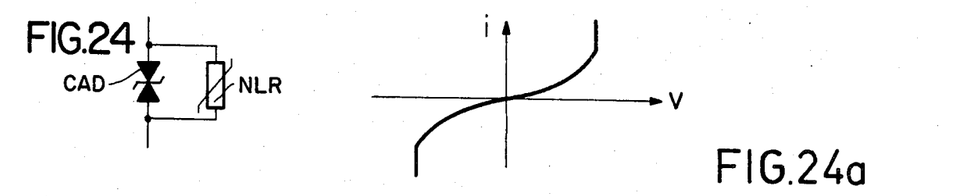
Figure 25:
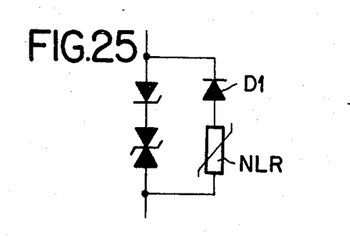

The circuit configurations of FIGS. 23–25 employ voltage limiting resistors (NLR) having non-linear characteristic curves and employ CAD elements with sharply limiting voltage-current characteristic curves. The non-linear resistor is utilized for limitation of the commutation overvoltage, while the CAD element limits the thyristor voltage.

In the circuit of FIG. 23, NLR comes into the circuit only during the inverse direction of the thyristor (due to the diode D1) since it is only in this voltage direction that the commutation overvoltage is to be limited.

In the circuit configuration of FIG. 24, the voltage-current characteristic curve (FIG. 24a) can be seen to be symmetrical.

Figure 25A:
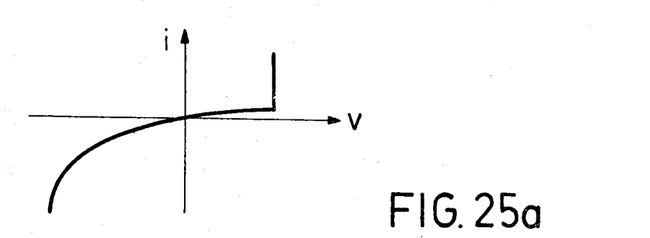

The voltage-current characteristic curve (FIG. 25a) for the circuit configuration of FIG. 25 can be seen to be asymmetrical. The non-linear resistance is active only in the inverse direction (due to diode D1) and is therefore only operational in this direction to limit the commutation overvoltage.

It should again be noted that the thyristor, in the blocking and inverse direction, has differentiating properties. In the blocking direction there is limited dv/dt stability, reverses and eventually lower voltage strength. In the inverse direction, the storage effect steps up commutation overshoot and eventually controlled avalanche behavior. Through the use of circuit configurations having asymmetric voltage characteristics an optimalization for both voltage directions is made possible.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. A circuit, comprising:
   (A) first and second nodes;
   (B) an input and an output lead connected to said first and second nodes, respectively, each of said input and output leads adapted to be coupled to an external circuit; and
   (C) a thyristor circuit including first and second parallel branches each coupled between said first and second nodes;
      (1) said first branch consisting of a thyristor, the anode of said thyristor being directly coupled to one of said first and second nodes, the cathode of said thyristor being directly coupled to the other of said first and second nodes; and
      (2) said second branch including a plurality of series connected sub-circuits, each of said sub-circuits including at least one electrical element, at least two of said sub-circuits having different voltage-current characteristic curves, at least one of said sub-circuits including first and second sub-branches connected together in parallel, said first sub-branch containing a controlled avalanche diode comprising first and second series connected diodes connected in opposed polarity fashion and exhibiting controlled avalanche behavior, and said second sub-branch including a resistor.

2. The circuit of claim 1, wherein said at least one of said sub-circuits further includes: a second controlled avalanche diode connected in series with said first and second sub-branches, said second controlled avalanche diode comprising third and fourth series connected diodes connected in opposed polarity fashion and exhibiting controlled avalanche behavior; and a second resistor coupled in parallel across both said first and second series connected controlled avalanche diodes.

3. The circuit of claim 1, wherein said second one of said sub-branches further includes a capacitor in series with said resistor.

4. The circuit of claim 1, wherein said at least one of said sub-circuits further includes: a second controlled avalanche diode coupled in series with said first and second sub-branches, said second controlled avalanche diode comprising third and fourth series connected diodes connected in opposed polarity fashion and exhibiting controlled avalanche behavior; and a second resistor coupled in parallel with both said second controlled avalanche diode and a capacitor.

5. The circuit of claim 1, wherein said at least one of said sub-circuits further includes: a second controlled avalanche diode coupled in series with said first and second sub-branches, said second controlled avalanche diode comprising third and fourth series connected diodes connected in opposed polarity fashion and exhibiting controlled avalanche behavior; and a series connected second resistor and capacitor connected in parallel across said first and second controlled avalanche diodes.

6. The circuit of claim 4, wherein said at least one of said sub-circuits further includes a third resistor coupled in series with said first and second controlled avalanche diodes.

7. The circuit of claim 1, wherein said second one of said sub-branches further includes a capacitor coupled in series with said resistor and wherein said at least one of said sub-circuits further includes: a second controlled avalanched diode coupled in series with said first and second sub-branches and comprising third and fourth series connected diodes connected in opposed polarity fashion and exhibiting controlled avalanche behavior; and a series connected second resistor and second capacitor coupled in parallel across said second controlled avalanche diode.

8. The circuit of claim 1, wherein said second one of said sub-branches further includes a capacitor coupled in series with said resistor and wherein said at least one of said sub-circuits further includes: a second controlled avalanche diode coupled in series with first and second subbranches and comprising third and fourth series connected diodes connected in opposed polarity fashion and exhibiting controlled avalanche behavior; and a parallel connected second capacitor and second resistor coupled in parallel across said second controlled avalanche diode.

9. The circuit of claim 1, wherein said at least one of said sub-circuits further includes a diode connected in series with said first and second sub-branches and a resistor coupled in series with said diode.

10. The circuit of claim 1, wherein said at least one of said sub-circuits further includes a conventional diode connected in series with said first and second subbranches and a second resistor and a capacitor connected in parallel across said conventional diode.

11. The circuit of claim 1, wherein said second sub-branch further includes a capacitor coupled in series with said resistor and wherein said at least one of said sub-circuits further includes: a conventional diode coupled in series with said first and second sub-branches and a second resistor connected in parallel across said conventional diode.

12. The circuit of claim 1, wherein said second sub-branch further includes a capacitor connected in series with said resistor and wherein said at least one of said sub-circuits further includes: third and fourth parallel connected sub-branches connected in series with said first and second sub-branches, said third sub-branch including a series connected conventional diode and voltage limiting diode, said fourth sub-branch including a series connected second capacitor and second resistor.

* * * * *